US012069803B2

(12) United States Patent
Hong

(10) Patent No.: US 12,069,803 B2
(45) Date of Patent: Aug. 20, 2024

(54) INTERPOSER AND ELECTRONIC DEVICE INCLUDING THE SAME

(71) Applicant: SAMSUNG ELECTRONICS CO., LTD., Suwon-si (KR)

(72) Inventor: Eunseok Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 171 days.

(21) Appl. No.: 17/889,735

(22) Filed: Aug. 17, 2022

(65) Prior Publication Data

US 2023/0054493 A1 Feb. 23, 2023

Related U.S. Application Data

(63) Continuation of application No. PCT/KR2022/011568, filed on Aug. 4, 2022.

(30) Foreign Application Priority Data

Aug. 17, 2021 (KR) .......................... 10-2021-0108335

(51) Int. Cl.
*H05K 1/11* (2006.01)
*G06F 1/16* (2006.01)
(Continued)

(52) U.S. Cl.
CPC ............ *H05K 1/111* (2013.01); *G06F 1/1684* (2013.01); *H05K 1/115* (2013.01); *H05K 1/144* (2013.01);
(Continued)

(58) Field of Classification Search
CPC .......... H05K 1/11; H05K 1/111; H05K 1/115; H05K 1/144; H05K 1/185; G06F 1/1684
(Continued)

(56) References Cited

U.S. PATENT DOCUMENTS 8,149,585 B2 4/2012 Kawano
8,637,995 B2 1/2014 Sadaka
(Continued)

FOREIGN PATENT DOCUMENTS

CN 103258782 8/2013
JP 2016-225360 12/2016
(Continued)

OTHER PUBLICATIONS

Search Report dated Nov. 30, 2022 in counterpart International Patent Application No. PCT/KR2022/011568.
(Continued)

*Primary Examiner* — Tremesha S Willis
(74) *Attorney, Agent, or Firm* — Nixon & Vanderhye, P.C.

(57) ABSTRACT

An example electronic device includes a housing, a first board and a second board disposed in an interior of the housing and disposed to face each other in a first direction, an interposer extending to surround an interior space between the first board and the second board, a first conductive layer disposed to face the first board and including a first conductive area, a second conductive layer disposed to face the second board and including a second conductive area, an insulation layer disposed between the first conductive layer and the second conductive layer, a first insulation part disposed between the first conductive layer and the first board and covering the first conductive area, a second insulation part disposed between the second conductive layer and the second board and covering the second conductive area, a first plating area extending from the first conductive layer to the second conductive layer, on a first side surface of the insulation layer, and a second plating area extending from the first conductive layer to the second (Continued)

conductive layer, on a second side surface of the insulation layer.

20 Claims, 10 Drawing Sheets

(51) Int. Cl.
  *H05K 1/14* (2006.01)
  *H05K 1/18* (2006.01)
(52) U.S. Cl.
  CPC ....... *H05K 1/185* (2013.01); *H05K 2201/096* (2013.01); *H05K 2201/10378* (2013.01)
(58) Field of Classification Search
  USPC ........................................................ 174/260
  See application file for complete search history.

(56) References Cited

U.S. PATENT DOCUMENTS

| | | |
|---|---|---|
| 8,970,045 B2 | 3/2015 | Sadaka |
| 10,283,492 B2 | 5/2019 | Gamini |
| 10,312,613 B2 | 6/2019 | Taylor |
| 10,636,780 B2 | 4/2020 | Gamini |
| 10,638,608 B2 | 4/2020 | Hoang et al. |
| 10,674,607 B2 | 6/2020 | Park et al. |
| 10,755,996 B2 | 8/2020 | Maekawa et al. |
| 10,785,876 B2 | 9/2020 | Sugiyama et al. |
| 10,939,552 B2 | 3/2021 | Park et al. |
| 11,076,485 B2 | 7/2021 | Kim et al. |
| 11,266,011 B2 | 3/2022 | Noh et al. |
| 11,388,277 B2 | 7/2022 | Kim et al. |
| 2008/0017407 A1 | 1/2008 | Kawano |
| 2016/0379967 A1 | 12/2016 | Gamini |
| 2019/0053380 A1 | 2/2019 | Sugiyama et al. |
| 2019/0080977 A1 | 3/2019 | Maekawa et al. |
| 2019/0082534 A1 | 3/2019 | Hoang et al. |
| 2019/0082536 A1 | 3/2019 | Park et al. |
| 2019/0082538 A1 | 3/2019 | Hoang et al. |
| 2020/0296833 A1 | 9/2020 | Park et al. |
| 2021/0099560 A1 | 4/2021 | Kim et al. |
| 2021/0185814 A1 | 6/2021 | Park et al. |
| 2021/0251070 A1 | 8/2021 | Noh et al. |

FOREIGN PATENT DOCUMENTS

| | | |
|---|---|---|
| JP | 2021-002554 | 1/2021 |
| KR | 10-2009-0024406 | 3/2009 |
| KR | 10-2019-0029215 | 3/2019 |
| KR | 10-2019-0099739 | 8/2019 |
| KR | 10-2020-0116414 | 10/2020 |
| KR | 10-2021-0054431 | 5/2021 |
| WO | 2016/093520 | 6/2016 |

OTHER PUBLICATIONS

Written Opinion dated Nov. 30, 2022 in counterpart International Patent Application No. PCT/KR2022/011568.

INTERPOSER AND ELECTRONIC DEVICE INCLUDING THE SAME

CROSS-REFERENCE TO RELATED APPLICATIONS

This application is a continuation of International Application No. PCT/KR2022/011568 designating the United States, filed on Aug. 4, 2022, in the Korean Intellectual Property Receiving Office and claiming priority to Korean Patent Application No. 10-2021-0108335, filed on Aug. 17, 2021, in the Korean Intellectual Property Office, the disclosures of which are incorporated by reference herein in their entireties.

BACKGROUND

Field

The disclosure relates to an interposer and an electronic device including the same.

Description of Related Art

As more functions are provided in an electronic device, clock frequencies of electric elements become higher and data transmission speeds become higher. Due to the electric elements that are operated at high frequencies, electromagnetic interferences (EMIs) may occur. A malfunction of the electronic device may be caused by the electromagnetic interferences.

An electronic device may include two or more boards, on which the electric elements are mounted. The two or more boards may be disposed to overlap each other and the electronic device may include an interposer for electrically connecting the two or more boards.

The interposer may include a plurality of layers, and vias that pass through at least some of the plurality of layers. The interposer may include a plating area connected to a ground of the board for a shielding function. The plating area may include a conductive material (e.g., copper) and a metal (e.g., gold) that has a low reactivity for preventing corrosion of the conductive material. This may, for example, cause an increase in costs of a plating process.

SUMMARY

Embodiments of the disclosure provide an interposer that includes a large number of vias as compared with a conventional interposer, and in which an added via may be utilized as a signal via.

Embodiments of the disclosure provide an interposer that may stably maintain a side plating area without a plating process that uses relatively expensive gold.

An electronic device according to an example embodiment disclosed in the disclosure may include: a housing, a first board and a second board disposed in an interior of the housing and disposed to face each other in a first direction, an interposer extending to surround an interior space between the first board and the second board, a first conductive layer disposed to face the first board and including a first conductive area, a second conductive layer disposed to face the second board and including a second conductive area, an insulation layer disposed between the first conductive layer and the second conductive layer, a first insulation part disposed between the first conductive layer and the first board and covering the first conductive area, a second insulation part disposed between the second conductive layer and the second board and covering the second conductive area, a first plating area extending from the first conductive layer to the second conductive layer, on a first side surface of the insulation layer, a second plating area extending from the first conductive layer to the second conductive layer, on a second side surface of the insulation layer, a ground via including a first part passing through the first insulation part and connected to the first conductive area, and a second part passing through the second insulation part and connected to the second conductive area, wherein the first conductive area and the second conductive area are electrically connected to each other through the first plating area, and a signal via passing from the first insulation part to the second insulation part.

According to various example embodiments disclosed in the disclosure, corrosion of the plating area may be prevented because the interposer includes a plating area and an insulation part that covers the plurality of layers. Accordingly, costs for the plating process may be decreased. Furthermore, a larger number of signal vias may be provided through laser machining of the insulation part. In addition, the disclosure may provide various effects that are directly or indirectly recognized.

BRIEF DESCRIPTION OF THE DRAWINGS

The above and other aspects, features and advantages of certain embodiments of the present disclosure will be more apparent from the following detailed description, taken in conjunction with the accompanying drawings, in which.

With regard to description of drawings, the same or similar components may be marked by the same or similar reference numerals.

DETAILED DESCRIPTION

Hereinafter, various example embodiments of the disclosure will be described in greater detail with reference to the accompanying drawings. Accordingly, those of ordinary skill in the art will recognize that modification, equivalent, and/or alternative on the various embodiments described herein can be variously made without departing from the scope and spirit of the disclosure.

Figure 1:
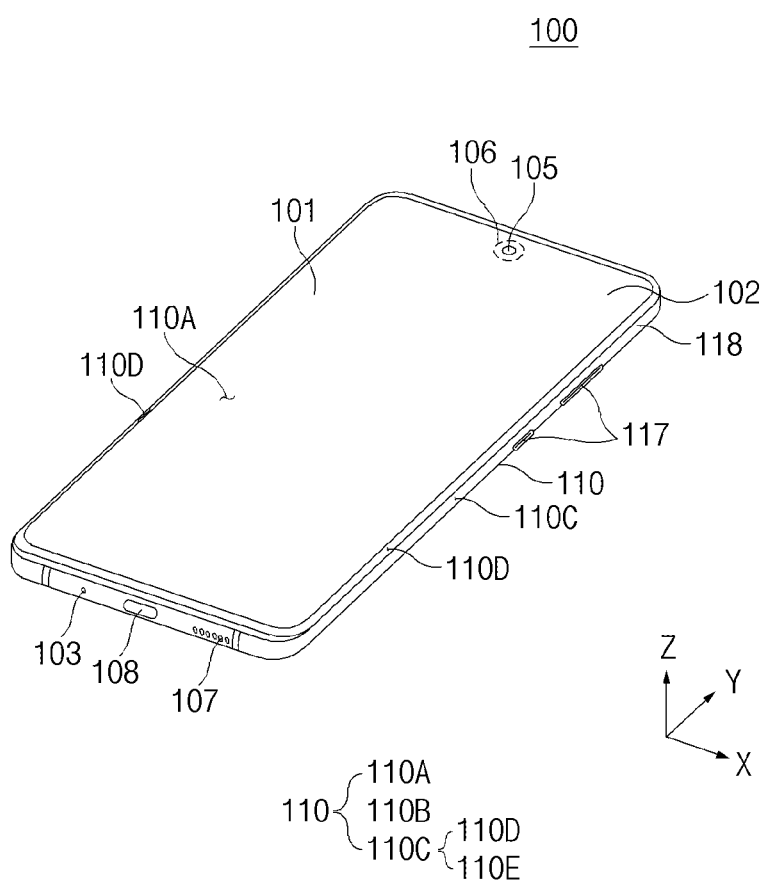
FIG. 1 is a perspective view of a front surface of an example electronic device according to an embodiment.
Figure 2:
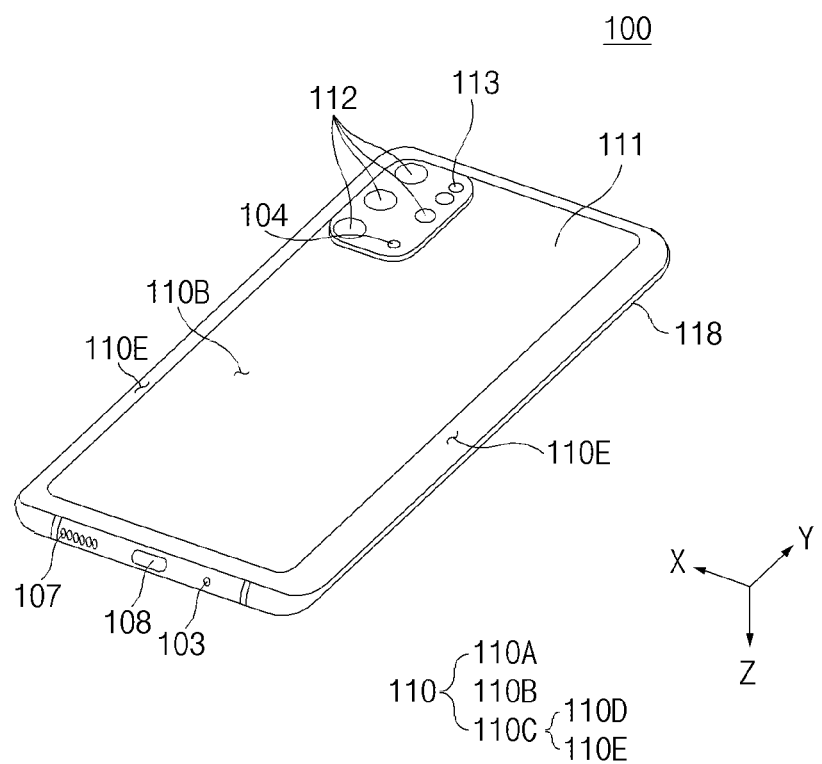
FIG. 2 is a perspective view of a rear surface of an example electronic device according to an embodiment.
Figure 3:
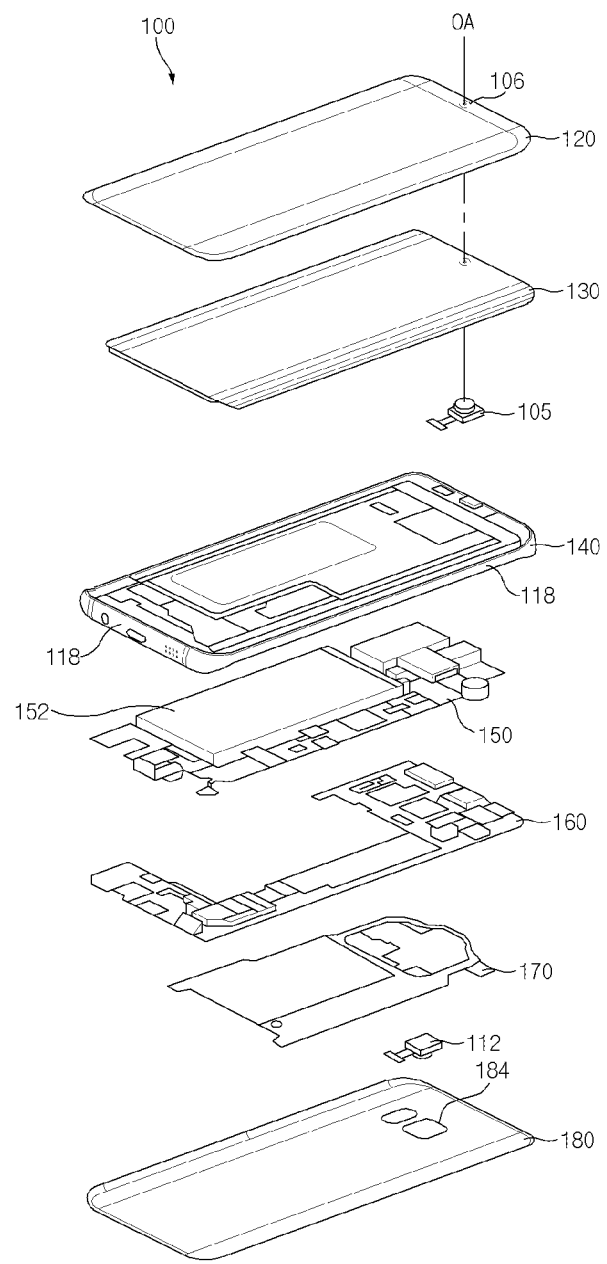
FIG. 3 is an exploded perspective view of an example electronic device according to an embodiment.

FIG. 1 is a front perspective view of an example electronic device 100 according to an embodiment. FIG. 2 is a rear perspective view of the example electronic device 100 according to an embodiment. FIG. 3 is an exploded perspective view of the example electronic device 100 according to an embodiment.

Referring to FIGS. 1 and 2, the electronic device 100 may include a housing 110 including a first surface (or a front surface) 110A, a second surface (or a rear surface) 110B, and a side surface 110C that surrounds a space between the first surface 110A and the second surface 110B.

In another embodiment (not illustrated), the housing 110 may refer, for example, to a structure that defines some of the first surface 110A, the second surface 110B, and the side surface 110C.

According to an embodiment, the first surface 110A may be defined by a front plate 102 (e.g., a front plate 120 of FIG. 3), at least a portion of which is substantially transparent. In an embodiment, the front plate 102, for example, may include a glass plate or a polymer plate including various coating layers. According to an embodiment, the second surface 110B may be defined by a rear plate 111 (e.g., a rear plate 180 of FIG. 3), which is substantially opaque. The rear plate 111, for example, may be formed of coated or colored glass, ceramics, a polymer, a metal (e.g., aluminum, stainless steel (STS), or magnesium), or a combination of at least two thereof. The side surface 110C may be coupled to the front plate 102 and the rear plate 111, and may be defined by a side bezel structure 118 including a metal and/or a polymer.

In another embodiment, the rear plate 111 and the side bezel structure 118 may be integrally formed and may include the same material (e.g., a metallic material such as aluminum).

In the illustrated embodiment, the front plate 102 may include two first areas 110D that are deflected from a partial area of the first surface 110A toward the rear plate 111 and extend seamlessly. The first areas 110D may be respectively located at both ends of a long edge of the front plate 102.

In the illustrated embodiment, the rear plate 111 may include two second areas 110E that are deflected from a partial area of the second surface 110B toward the front plate 102 and extend seamlessly. The second areas 110E may be included at both ends of a long edge of the rear plate 111 respectively.

In another embodiment, the front plate 102 (or the rear plate 111) may include only one of the first areas 110D (or the second areas 110E). Furthermore, in another embodiment, the front plate 102 (or the rear plate 111) may not include some of the first areas 110D (or the second areas 110E).

In an embodiment, when viewed from a side of the electronic device 100, the side bezel structure 118 may have a first thickness (width) on a lateral side (e.g., a short edge), on which neither the first areas 110D nor the second areas 110E are included, and may have a different second thickness that is smaller than the first thickness on a lateral side (e.g., a long edge), on which the first areas 110D or the second areas 110E are included.

In an embodiment, the electronic device 100 may include at least one of a display 101, audio modules 103, 104, and 107, a sensor module (not illustrated), camera modules 105 and 112, a key input device 117, a light emitting element (not illustrated), and a connector hole 108. In another embodiment, at least one (e.g., the key input device 117 or the light emitting element (not illustrated)) of the elements may be omitted from the electronic device 100 and/or another component may be additionally included in the electronic device 100.

In an embodiment, the display 101 may be exposed through at least a portion of the front plate 102. For example, at least a portion of the display 101 may be exposed through the front plate 102 that defines the first surface 110A, and the first areas 110D of the side surface 110C.

In an embodiment, a shape of the display 101 may have a shape that is substantially the same as the adjacent outer shape of the front plate 102. In other embodiments (not illustrated), in order to expand the area to which the display 101 is exposed, when viewed from above the front plate 102, the outer perimeter of the display 101 and the outer perimeter of the front plate 102 may formed to be substantially the same, but is not limited thereto.

In an embodiment, a surface (or the front plate 102) of the housing 110 may include a screen display area, through which the display 101 is visually exposed and in which contents are displayed through pixels. For example, the screen display area may include the first surface 110A, and the first areas 110D of the side surface.

In another embodiment (not illustrated), the display areas 110A and 110D may include a sensing area (not illustrated) configured to acquire biometric information of a user. Here, the expression that "the display areas 110A and 110D include a sensing area" may be understood to refer, for example to at least a portion of the sensing area overlapping the display areas 110A and 110D. For example, the sensing area (not illustrated) may display contents on the display 101 like other areas of the screen display areas 110A and 110D, and additionally, may refer to an area that may acquire biometric information (e.g., a fingerprint) of the user.

In an embodiment, the display areas 110A and 110D of the display 101 may include a camera area 106. For example, the camera area 106 may be an area, through which light reflected by a subject and received by the first camera module 105 passes. For example, the camera area 106 may be an area, through which an optical axis of the first camera module 105 passes. Here, the expression that "the display areas 110A and 110D include the camera area 106" may be understood to refer, for example, to at least a portion of the camera area 106 overlapping the display areas 110A and 110D. For example, in the camera area 106, contents may be displayed on the display 101 as in another area of the display areas 110A and 110D.

In various embodiments (not illustrated), the screen display areas 110A and 110D of the display 101 may include an area, in which the first camera module 105 (e.g., a punch hole camera) may be visually exposed. For example, at least a portion of an edge of the exposed area of the first camera module 105 may be surrounded by the screen display areas 110A and 110D. In an embodiment, the first camera module 105 may include a plurality of camera modules.

In an embodiment, at least one of the audio modules 103, 104, and 107, the sensor modules (not illustrated), the camera module (e.g., the first camera module 105), and the light emitting elements (not illustrated) may be included on the rear surfaces of the screen display areas 110A and 110D of the display 101. For example, in the electronic device 100, the camera module (e.g., the first camera module 105) may be disposed on the first surface 110A (e.g., the first surface) and/or a rear surface (e.g., a surface that faces the −X axis direction) of the side surface 110C (e.g., at least one surface of the first area 110D) to face the first surface 110A and/or the side surface 110C. For example, the first camera module 105 may not be visually exposed to the screen display areas 110A and 110D, and may include an under display camera (UDC).

In other embodiments (not illustrated), the display 101 may include or be disposed to be adjacent to a touch detection circuit, a pressure sensor that may measure the strength (the pressure) of a touch, and/or a digitizer that detects a stylus pen of a magnetic field type.

According to an embodiment, the audio modules 103, 104, and 107 may include the microphone holes 103 and 104 and the speaker hole 107.

In an embodiment, the microphone holes 103 and 104 may include the first microphone hole 103 formed in a partial area of the side surface 110C, and the second microphone hole 104 formed in a partial area of the second surface 110B. Microphones for obtaining external sound may be disposed in interiors of the housing 110. The microphones may include a plurality of microphones to sense a direction of sound. In an embodiment, the second microphone hole 104 formed in a partial area of the second surface 110B may be disposed to be adjacent to the camera modules 105 and 112. For example, the second microphone hole 104 may acquire sound during use of the camera modules 105 and 112 or may acquire sound during use of another function.

In an embodiment, the speaker hole 107 may include a call receiver hole (not illustrated). The speaker hole 107 may be formed at a portion of the side surface 110C of the electronic device 100. In another embodiment, the speaker hole 107 and the microphone hole 103 may be implemented with one hole. Although not illustrated, the call receiver hole (not illustrated) may be formed at another portion of the side surface 110C. For example, the call receiver hole (not illustrated) may be formed at a portion (e.g., a portion that faces the +Y axis direction) of the side surface 110C, which faces a portion (e.g., a portion that faces the −Y axis direction) of the side surface 110C, at which the speaker hole 107 is formed.

In an embodiment, the electronic device 100 may include a speaker fluid-communicated with the speaker hole 107. In another embodiment, the speaker may include a piezoelectric speaker, from which the speaker hole 107 is omitted.

In an embodiment, the sensor module (not illustrated) may generate an electrical signal or a data value corresponding to an operation state of the interior of the electronic device 100 or an environmental state of the outside. In an embodiment, the sensor module (not illustrated) may be disposed at at least a portion of the first surface 110A, the second surface 110B, and the side surface 110C (e.g., the first areas 110D and/or the second areas 110E) of the housing 110, and may be disposed (e.g., a fingerprint sensor) on the rear surface of the display 101. For example, at least a portion of the sensor module (not illustrated) may be disposed under the display areas 110A and 110D not to be visually exposed, and a sensing area (not illustrated) may be formed at at least a portion of the display areas 110A and 110D. For example, the sensor module (not illustrated) may include an optical fingerprint sensor. In some embodiments (not illustrated), the fingerprint sensor may be disposed not only on the first surface 110A (e.g., the screen display areas 110A and 110D) but also on the second surface 110B of the housing 110. For example, the sensor module may include at least one of a proximity sensor, an HRM sensor, a fingerprint sensor, a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, and an illumination sensor.

In an embodiment, the key input device 117 may be disposed in the side surface 110C (e.g., the first areas 110D and/or the second areas 110E) of the housing 110. In another embodiment, the electronic device 100 may not include some or all of the above-mentioned key input devices 117 and the key input devices 117, which are not included, may be realized in different forms, such as a soft key, on the display 101. In another embodiment, the key input device may include a sensor module (not illustrated) that defines a sensing area (not illustrated) included in the display areas 110A and 110D.

In an embodiment, the connector hole 108 may accommodate connectors. The connector hole 108 may be disposed on the side surface 110C of the housing 110. For example, the connector hole 108 may be disposed on the side surface 110C to be adjacent to at least a portion of the audio modules (e.g., the microphone hole 103 and the speaker hole 107). In another embodiment, the electronic device 100 may include the first connector hole 108 that may accommodate a connector (e.g., a USB connector) for transmitting and receiving electric power and/or data to and from an external electronic device and/or a second connector hole (not illustrated) that may accommodate a connector (e.g., an earphone jack) for transmitting and receiving an audio signal to and from the external device.

In an embodiment, the electronic device 100 may include a light emitting element (not illustrated). For example, the light emitting element (not illustrated) may be disposed on the first surface 110A of the housing 110. The light emitting element (not illustrated) may provide state information on the electronic device 100 in the form of light. In another embodiment, the light emitting element (not illustrated) may provide a light source that interworks with an operation of the first camera module 105. For example, the light emitting element (not illustrated) may include an LED, an IR LED, and/or a xenon lamp.

In an embodiment, the camera modules 105 and 112 may include the first camera module 105 (e.g., an under display camera) that receives light through the camera area 106 of the first surface 110A of the electronic device 100, the second camera module 112 that receives light through a partial area (e.g., a rear camera area 184 of FIG. 3) of the second surface 110B, and a flash 113.

In an embodiment, the first camera module 105 may include an under display camera (UCD) disposed on a rear surface of the display 101. For example, the first camera module 105 may be located in some layers of the display 101, or may be located such that an optical axis of a lens passes through the display areas 110A and 110D. In various embodiments, the first camera module 105 may be configured to receive light though the camera area 106 included in the display areas 110A and 110D. For example, the camera area 106 may be configured to display contents like other areas of the display areas 110A and 110D when the first camera module 105 is not operated. For example, when the first camera module 105 is operated, the camera area 106 does not display contents and the first camera module 105 may receive light through the camera area 106.

In various embodiments (not illustrated), the first camera module 105 (e.g., a punch hole camera) may be exposed through a portion of the display areas 110A and 110D of the display 101. For example, the first camera module 105 may be exposed through a partial area of the screen display areas 110A and 110D through an opening formed at a portion of the display 101.

In an embodiment, the second camera module 112 may include a plurality of camera modules (e.g., a dual camera, a triple camera, or a quad camera). However, the second camera module 112 is not limited to including a plurality of camera modules, and may include one camera module.

In an embodiment, the first camera module 105 and/or the second camera module 112 may include one or a plurality of lenses, an image sensor, and/or an image signal processor. The flash 113, for example, may include a light emitting diode or a xenon lamp. In another embodiment, two or more lenses (an infrared ray camera, and a wide angle/telephoto lens), and image sensors may be disposed in an interior of the housing to face a direction, which one surface (e.g., the second surface 110B) of the electronic device 100 faces.

Referring to FIG. 3, the electronic device 100 may include the side bezel structure 118, a first support member 140 (e.g., the bracket), the front plate 120 (e.g., the front plate 102 of FIG. 1), a display 130 (e.g., the display 101 of FIG. 2), a printed circuit board 150 (e.g., a printed circuit board (PCB), a flexible PCB (FPCB), or a rigid-flexible PCB (RFPCB)), a battery 152, a second support member 160 (e.g., the rear case), an antenna 170, and/or the rear plate 180 (e.g., the rear plate 111 of FIG. 2). In some embodiments, at least one (e.g., the first support member 140 or the second support member 160) of the elements may be omitted from the electronic device 100 and/or another component may be additionally included in the electronic device 100. At least one of the components of the electronic device 100 may be the same as or similar to at least one of the components of the electronic device 100 of FIGS. 1 and 2, and the description will not be repeated here.

In an embodiment, the first support member 140 may be disposed in the interior of the electronic device 100 to be connected to the side bezel structure 118 or to be integrally formed with the side bezel structure 118. The first support member 140, for example, may be formed of a metal material and/or a nonmetal material (e.g., a polymer). The display 130 may be coupled to or located on one surface of the first support member 140, and the printed circuit board 150 may be coupled to or located on an opposite surface of the first support member 140.

In an embodiment, a processor, a memory, and/or an interface may be mounted on the printed circuit board 150. The processor, for example, may include one or more of a central processing unit, an application processor, a graphic processing unit, an image signal processor, a sensor hub processor, or a communication processor.

In an embodiment, the memory, for example, may include a volatile and/or nonvolatile memory.

In an embodiment, the interface, for example, may include a high definition multimedia interface (HDMI), a universal serial bus (USB), an SD card interface, and/or an audio interface. The interface, for example, may electrically or physically connect the electronic device 100 to an external electronic device, and may include a USB connector, an SD card/MMC connector, and an audio connector.

According to an embodiment, the battery 152 is a device for supplying electric power to at least one component of the electronic device 100, and for example, may include a primary battery that cannot be recharged, a secondary battery that may be recharged, or a fuel cell. At least a portion of the battery 152, for example, may be disposed on substantially the same plane as the printed circuit board 150. The battery 152 may be integrally disposed in the interior of the electronic device 100, and may be disposed to be detachable from the electronic device 100.

According to an embodiment, the antenna 170 may be disposed between the rear plate 180 and the battery 152. The antenna 170, for example, may include a near field communication (NFC) antenna, a wireless charging antenna, and/or a magnetic secure transmission (MST) antenna. The antenna 170, for example, may perform short-range communication with an external device, or may wirelessly transmit and receive electric power that is necessary for charging. In another embodiment, an antenna structure may be formed by one or a combination of the side bezel structure 118 and/or the first support member 140.

In an embodiment, the first camera module 105 may be coupled to the rear surface of the display 130 to receive light through the camera area 106 of the front plate 120. For example, at least a portion of the first camera module 105 may be disposed in the first support member 140. For example, an image sensor of the first camera module 105 may receive light that passes through the camera area 106, and a pixel array included in the display 130. For example, the camera area 106 may at least partially overlap the display area, on which contents are displayed. For example, an optical axis OA the first camera module 105 may pass through a partial area of the display 130 and the camera area 106 of the front plate 120. For example, the partial area may include a pixel array including a plurality of light emitting elements. In an embodiment, a partial area of the display 130, which faces the first camera module 105, may be a portion of the display area, on which the contents are displayed, and may be a transmission area having a specific transmittivity. In an embodiment, the transmission area may be formed to have a transmittivity ranging from about 5% to about 25%. In an embodiment, the transmission area may be formed to have a transmittivity ranging from about 25% to about 50%. In an embodiment, the transmission area may be formed to have a transmittivity of about 50% or more. The transmission area may include an area that overlaps an effective area (e.g., a field of view (FOV)) of the first camera module 105, through which light for generating an image by forming the image with an image sensor. For example, the transmission area of the display 130 may include an area having a low density and/or a low wiring density of pixels.

In an embodiment, the second camera module 112 may be disposed such that the lens is exposed through the rear camera area 184 of the rear plate 180 (or the rear surface 110B of FIG. 2) of the electronic device 100. The rear camera area 184 may be formed at at least a portion of a surface (e.g., the rear surface 110B of FIG. 2) of the rear plate 180. In an embodiment, the rear camera area 184 may be formed to be at least partially transparent such that the second camera module 112 receives external light through the rear camera area 184. In an embodiment, at least a portion of the rear camera area 184 may protrude from the surface of the rear plate 180 by a specific height. However, the disclosure is not limited thereto, and the rear camera area 184 may define a plane that is substantially the same as the surface of the rear plate 180.

Figure 4:
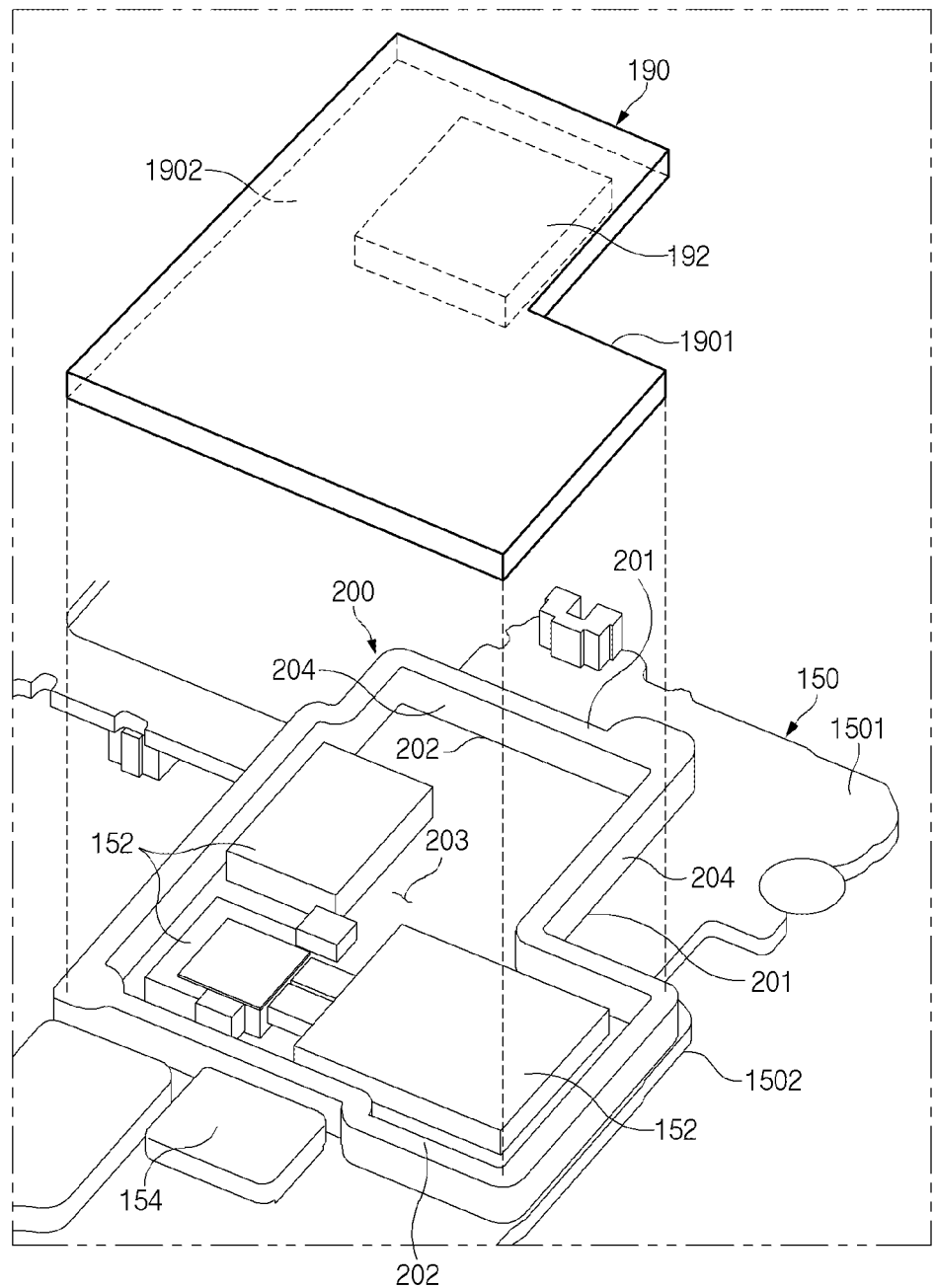
FIG. 4 is a view illustrating an example electronic device according to an embodiment.

FIG. 4 is a view illustrating an electronic device according to an embodiment.

Referring to FIG. 4, the electronic device 100 may include an interposer 200 (e.g., a shielding member) that electrically connects the first board 150 (e.g., the printed circuit board 150 of FIG. 3) and the second board 190. In an embodiment, the interposer 200 may define a shielding space 203 that may shield noise generated between the first board 150 and the second board 190 or introduced from an outside. In an embodiment, the interposer 200 may be provided in various shapes. For example, the interposer 200 may be provided in a polygonal shape. The interposer 200 may be provided in a ring shape that surrounds the shielding space 203. The shielding space 203 may include a partial area of the first board 150 and a partial area of the second board 190. A shape of the interposer 200 disclosed in the disclosure is not limited to those illustrated in the drawings.

In an embodiment, the first board 150 (e.g., the printed circuit board 150 of FIG. 3) may include one or more electric elements 152 and 154, a signal line that electrically connects the electric elements 152 and 154, and a ground. In an embodiment, the one or more electric elements 152 and 154 may include the first electric element 152 located in an interior of the shielding space 203 and the second electric element 154 located on an outside of (external to) the shielding space 203. In an embodiment, the first board 150 may include a first upper surface 1501 that faces a second lower surface 1902 of the second board 190, and a first lower surface 1502 that is opposite to the first upper surface 1501. Referring to the drawings, a partial area of the first upper surface 1501 of the first board 150 may be included in the shielding space 203. The first electric element 152 and the second electric element 154 may be disposed on the first upper surface 1501.

In an embodiment, the second board 190 may be located in a first direction from the first board 150. For example, the second board 190 may be disposed above the first upper surface 1501 of the first board 150 or may be disposed below the first lower surface 1502 of the first board 150. A location of the second board 190 may differ according to a kind and/or a function of a third electric element 192 mounted on the second board 190. The third electric element 192 may be located in an interior of the shielding space 203. Referring to the drawings, the third electric element 192 may be disposed on the second lower surface 1902 of the second board 190. The second board 190 may include the second lower surface 1902 that faces the first upper surface 1501 of the first board 150, and a second upper surface 1901 that is opposite to the second lower surface 1902. Referring to the drawings, at least a partial area of the second lower surface 1902 of the second board 190 may be included in the shielding space 203.

In an embodiment, the interposer 200 may extend to surround the shielding space 203 defined between the first board 150 and the second board 190. For example, the interposer 200 may include a first surface 201 that at least partially contacts the first upper surface 1501 of the first board 150, a second surface 202 that at least partially contacts the second lower surface 1902 of the second board 190, and a side surface 204 that surrounds a space between the first surface 201 and the second surface 202.

In various embodiments, the second board 190 may have various sizes. For example, the second board 190 may have the same size as that of the first board 150, may have a size that is smaller than that of the first board 150, or may have a size that is larger than that of the first board 150. The second board 190 may have a shape corresponding to the shape of the interposer 200. The shapes of the first board 150 and the second board 190 illustrated in the drawings are merely examples, and the boards may have various shapes.

In an embodiment, each of the first electric element 152, the second electric element 154, and the third electric element 192 may include an integrated circuit, an active element, or a passive element. For example, the first electric element 152 and the third electric element 192 disposed in an interior of the shielding space may include an electric element that requires shielding due to a high noise vulnerability as compared with the second electric element 154 or generates much noise.

According to an embodiment, because some electric elements are disposed in the second board 190, the interior space of the electronic device 100 may be efficiently utilized. According to an embodiment, the interposer 200 may not require a separate shield can in an aspect that the interposer 200 performs a shielding function, in addition to the electrical connection of the first board 150 and the second board 190.

Figure 5:
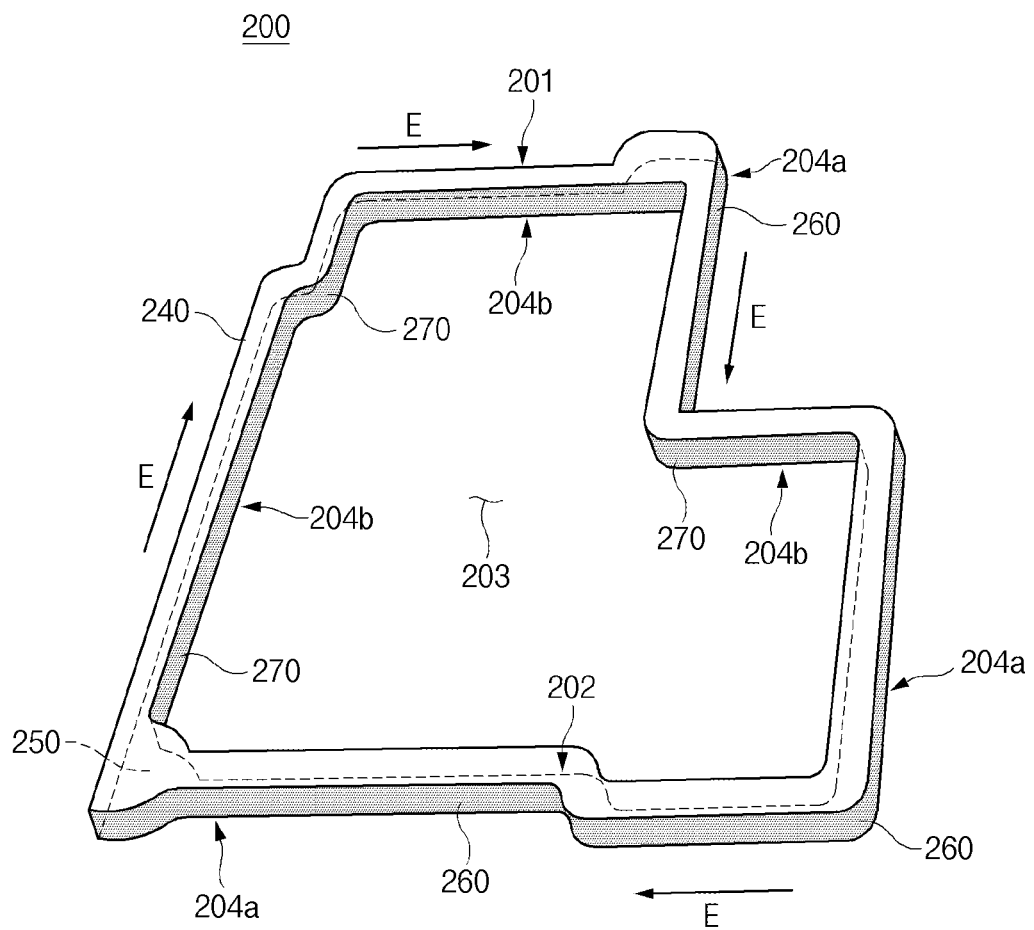
FIG. 5 is a view illustrating an interposer of an example electronic device according to an embodiment.

FIG. 5 is a view illustrating an interposer of an example electronic device according to an embodiment.

Referring to FIG. 5, the interposer 200 may include an insulation part including an insulation material. For example, the insulation material may include a preimpregnated material (PREPREG) (PPG) (e.g., an insulation resin). The insulation part may define at least a portion of an external appearance of the interposer 200. For example, the insulation part may be provided through a PPG filling process.

In an embodiment, the insulation part may include a first insulation part 240 that defines the first surface 201 of the interposer 200, a second insulation part 250 that defines the second surface 202 of the interposer 200, a first side insulation part 260 that defines an outer surface 204a, and a second side insulation part 270 that defines an inner surface 204b.

Figure 8:
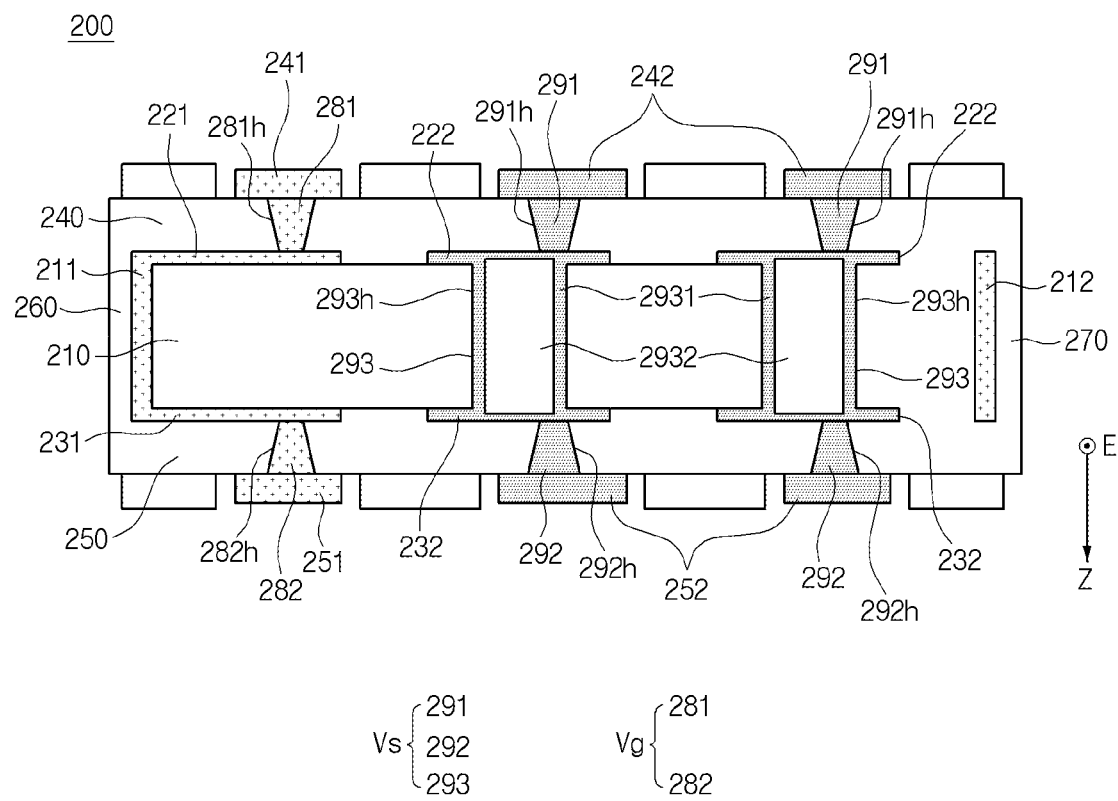
FIG. 8 is a cross-sectional view illustrating an interposer of an example electronic device according to an embodiment.
Figure 9:
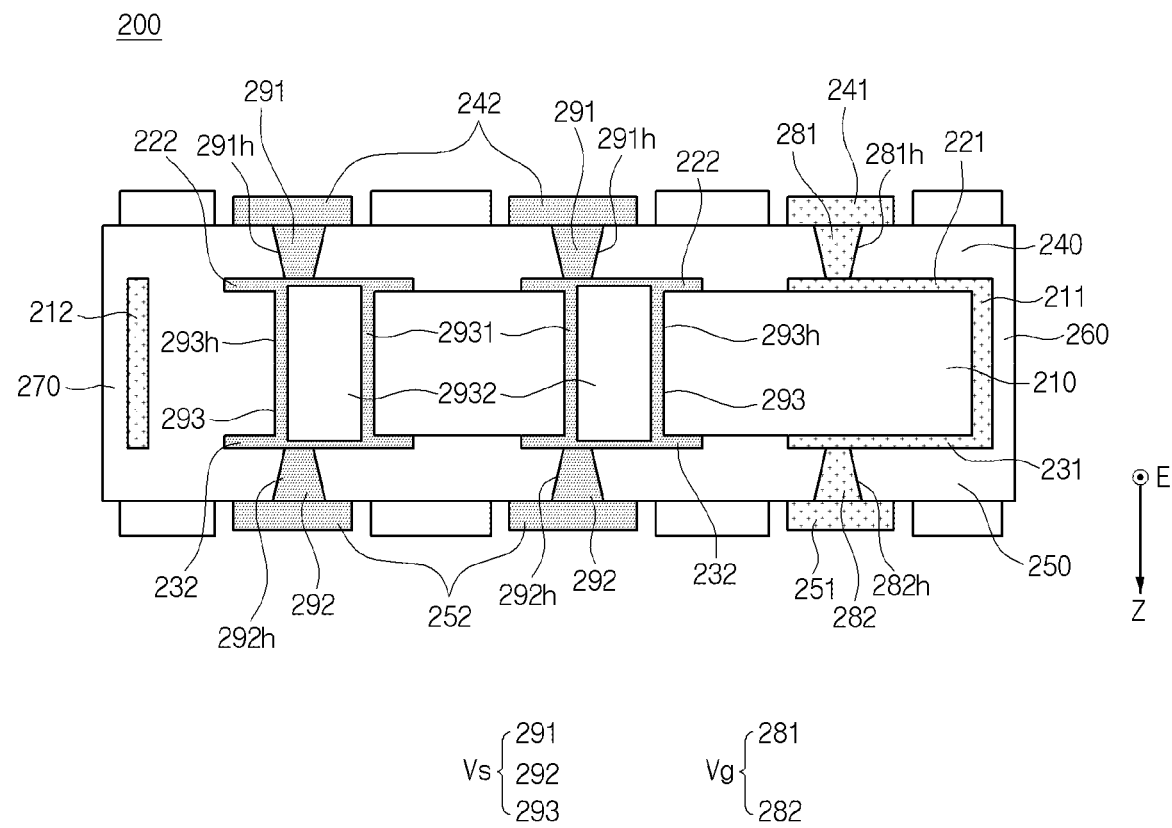
FIG. 9 is a cross-sectional view illustrating an interposer of an example electronic device according to an embodiment.

In an embodiment, conductive pads (not illustrated in FIG. 5) (e.g., a first conductive pad 241 and a second conductive pad 242 of FIGS. 8 and 9) electrically connected to the first board 150 may be disposed in the first insulation part 240. For example, when the first surface 201 of the interposer 200 is viewed from the top, it may correspond to the first insulation part 240 except for the conductive pads In an embodiment, conductive pads (not illustrated in FIG. 5) (e.g., a third conductive pad 251 and a fourth conductive pad 252 of FIGS. 8 and 9) electrically connected to the second board 190 may be disposed on the second insulation part 250. For example, when the second surface 202 of the interposer 200 is viewed from the top, it may correspond to the second insulation part 250 except for the conductive pads.

In an embodiment, the interposer 200 may extend in a closed form to surround the shielding space 203. An extension direction "E" of the interposer 200 may be a direction that is substantially perpendicular to the Z axis direction. The interposer 200 may include a linear section that extends substantially in a straight line, and/or a curved section that extends in a curved line.

Figure 6:
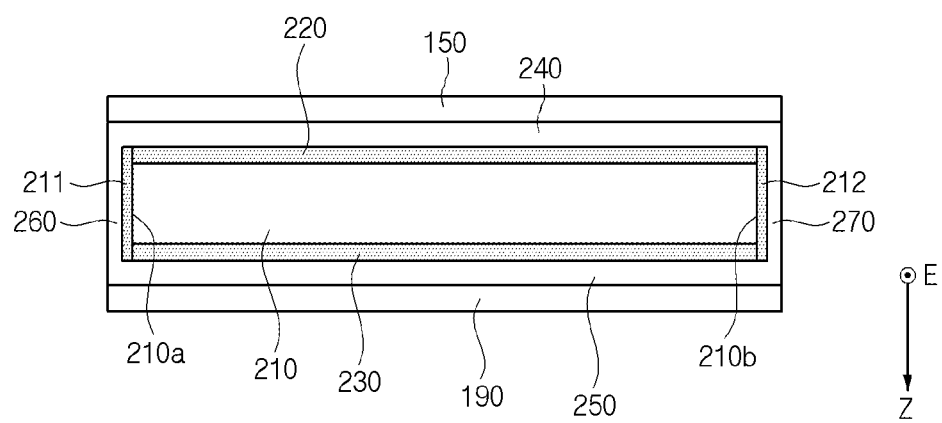
FIG. 6 is a cross-sectional view illustrating an example layer structure of an interposer and an insulation part according to an embodiment.

FIG. 6 is a cross-sectional view illustrating a layer structure of an interposer and an insulation part according to an embodiment. FIG. 6 is a cross-sectional view illustrating a cross-section that is perpendicular to the extension direction "E".

In an embodiment, the interposer 200 may include a layer structure, and an insulation part that surrounds the layer structure. In an embodiment, the layer structure may include a plurality of layers that are laminated in a first direction. For example, the layer structure may include a first conductive layer 220, an insulation layer 210, and a second conductive layer 230.

In an embodiment, the first conductive layer 220 may be disposed on a first surface (e.g., a surface in the −Z axis direction) of the insulation layer 210. The first conductive layer 220 may be covered by the first insulation part 240. The first conductive layer 220 may be disposed to face the first board 150. For example, the first insulation part 240 may be disposed between the first conductive layer 220 and the first board 150.

In an embodiment, the second conductive layer 230 may be disposed on a second surface (e.g., a surface in the Z axis direction) of the insulation layer 210. The second conductive layer 230 may be covered by the second insulation part 250. The second conductive layer 230 may be disposed to face the second board 190. For example, the second insulation part 250 may be disposed between the second conductive layer 230 and the second board 190.

In an embodiment, the insulation layer 210 may be disposed between the first conductive layer 220 and the second conductive layer 230. A first plating area 211 may be formed on a first side surface 210a of the insulation layer 210, and a second plating area 212 may be formed on a second side surface 210b. The first plating area 211 may be covered by the first side insulation part 260, and the second plating area 212 may be covered by the second side insulation part 270. The first plating area 211 may extend from the first conductive layer 220 to the second conductive layer 230 along the first side surface 210a of the insulation layer. The second plating area 212 may extend from the first conductive layer 220 to the second conductive layer 230 along the second side surface 210b of the insulation layer. In various embodiments, a plurality of via holes (e.g., a fifth part 293 of the signal via Vs of FIGS. 8 and 9) may be formed in the insulation layer 210. In an embodiment, the insulation layer 210 may be formed of various materials. For example, the insulation layer 210 may include at least one of polyimide, polyester, or polytetrafluoroethylene.

In an embodiment, the first insulation part 240 may be disposed between the first conductive layer 220 and the first board 150. The first insulation part 240 may, for example, be integrally formed with the first side insulation part 260 and the second side insulation part 270. In various embodiments, the conductive pads (e.g., the first conductive pad 241 and the second conductive pad 242 of FIGS. 8 and 9) may be formed on a surface of the first insulation part 240. A plurality of via holes (e.g., a first part 281 and a third part 291 of FIGS. 8 and 9) that pass through the first insulation part 240 may be formed in the first insulation part 240.

In an embodiment, the second insulation part 250 may be disposed between the second conductive layer 230 and the second board 190. The second insulation part 250 may, for example, be integrally formed with the first side insulation part 260 and the second side insulation part 270. In various embodiments, the conductive pads (e.g., the third conductive pad 251 and the fourth conductive pad 252 of FIGS. 8 and 9) may be formed on a surface of the second insulation part 250. A plurality of via holes (e.g., a second part 282 and a fourth part 292 of FIGS. 8 and 9) that pass through the second insulation part 250 may be formed in the second insulation part 250.

In an embodiment, the first side insulation part 260 may cover the first plating area 211. For example, the first side insulation part 260 may define an outer surface (e.g., the outer surface 204a of FIG. 5) of the interposer 200. The first side insulation part 260 may, for example, be integrally formed with the first insulation part 240 and the second insulation part 250.

In an embodiment, the second side insulation part 270 may cover the second plating area 212. For example, the second side insulation part 270 may define an inner surface (e.g., the inner surface 204b of FIG. 5) of the interposer 200. The second side insulation part 270 may be integrally formed with the first insulation part 240 and the second insulation part 250.

In an embodiment, the first plating area 211 may be disposed substantially in parallel to the outer surface of the interposer 200. The first plating area 211 may be connected to grounds of the first board 150 and the second board 190 to provide a shielding performance for the outer surface of the interposer 200. Because the first side insulation part 260 covers the first plating area 211, the first plating area 211 may be prevented from being oxidized.

In an embodiment, the second plating area 212 may be disposed substantially in parallel to the inner surface of the interposer 200. The second plating area 212 may be connected to grounds of the first board 150 and the second board 190 to provide a shielding performance for the inner surface of the interposer 200. Because the second side insulation part 270 covers the second plating area 212, the second plating area 212 may be prevented from being oxidized.

Figure 7:
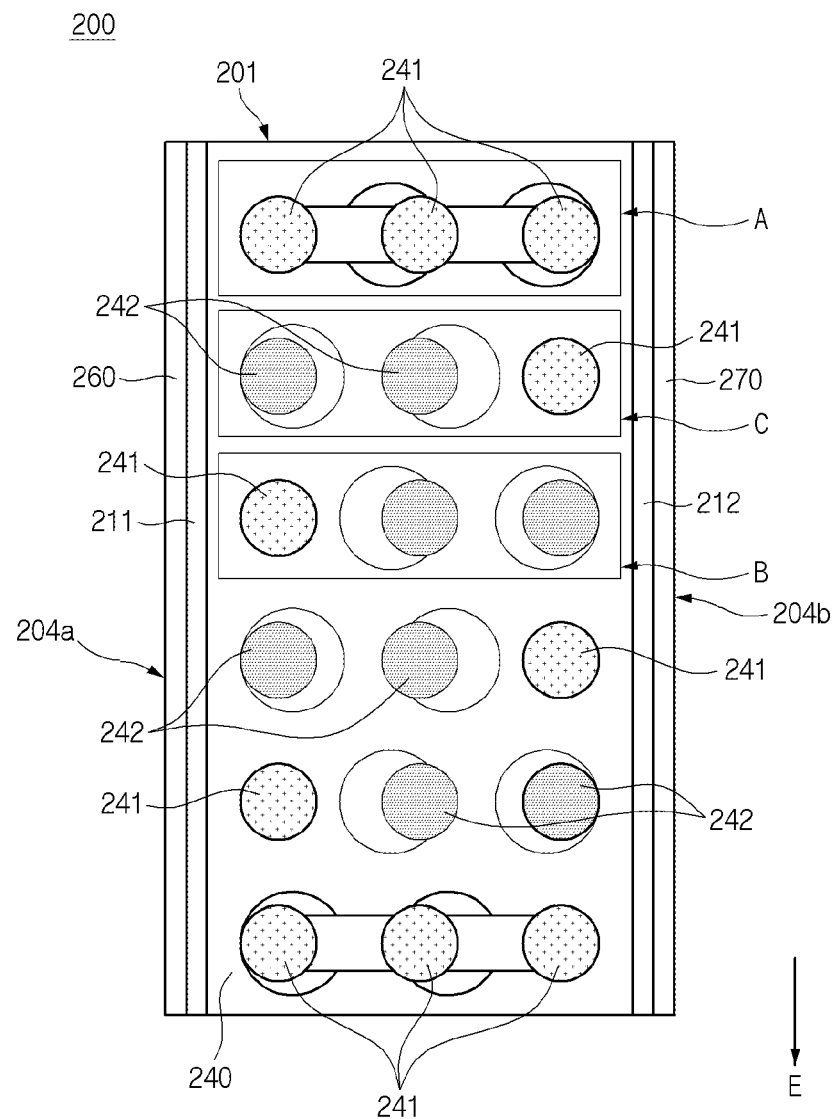
FIG. 7 is a plan view of an example interposer according to an embodiment.

FIG. 7 is a plan view of an example interposer according to an embodiment. FIG. 7 is a view of a first surface of the interposer, viewed from the top, according to an embodiment.

Hereinafter, the contents on the first surface 201, the first conductive pad 241, the second conductive pad 242, and the first insulation part 240 may be applied to the second surface 202, the third conductive pad (e.g., the third conductive pad 251 of FIGS. 8 and 9), the fourth conductive pad (e.g., the fourth conductive pad 252 of FIGS. 8 and 9), and the second insulation part (e.g., the second insulation part 250 of FIGS. 8 and 9) in substantially the same manner.

In an embodiment, the first conductive pad 241 and the second conductive pad 242 may be exposed from the first surface 201 of the interposer 200. The first conductive pad 241 and the second conductive pad 242 may be electrically connected to the first board (e.g., the first board 150 of FIG. 6). For example, the first conductive pad 241 and the second conductive pad 242 may be surface-mounted on the first board 150.

In an embodiment, the first conductive pad 241 may include a ground path. For example, the first conductive pad 241 may be connected to the ground via (e.g., a ground via Vg of FIGS. 8 and 9) that passes through at least a portion of the interposer 200, and the ground of the first board 150.

In an embodiment, the first conductive pad 241 may be surrounded by the first insulation part 240. The first conductive pad 241 may contact a ground pad of the first board 150. A plurality of first conductive pads 241 may be formed. For example, when viewed in the extension direction "E", some of the second conductive pads 242 may be disposed between the first conductive pads 241 that are adjacent to each other.

In an embodiment, the first conductive pad 241 may be disposed to be adjacent to the inner surface 204b or the outer surface 204a of the interposer 200. For example, the first conductive pad 241 may be disposed to be adjacent to the first plating area 211 or the second plating area 212 located in an interior of the interposer 200.

In an embodiment, the second conductive pad 242 may be included in a signal transmission path. For example, the second conductive pad 242 may be connected to the signal via (e.g., the signal via Vs of FIGS. 8 and 9) that passes through at least a portion of the interposer 200, and the signal line of the first board 150.

In an embodiment, the second conductive pad 242 may be surrounded by the first insulation part 240. The second conductive pad 242 may contact a signal pad of the first board 150. A plurality of second conductive pads 242 may be formed. When viewed in the extension direction, some of the second conductive pads 242 may be disposed between the first conductive pads 241.

In an embodiment, the first plating area 211 and the second plating area 212 may extend substantially in parallel to each other. The first plating area 211 and the second plating area 212 may extend along the extension direction "E" of the interposer 200 to surround the shielding space (e.g., the shielding space 203 of FIG. 5).

In an embodiment, the first conductive pad 241 and the second conductive pad 242 may be arranged in the extension direction "E" of the interposer while forming three columns. For example, when viewed in a direction that is perpendicular to the extension direction "E", at least three first conductive pads 241 and/or at least three second conductive pads 242 may be disposed to at least partially overlap each other.

In an embodiment, the interposer 200 may include a first area "A", a second area "B", and a third area "C" defined along the extension direction "E". For example, the first area "A" may include only the first conductive pad 241. For example, each of the second area "B" and the third area "C" may include the first conductive pad 241 and the second conductive pad 242. For example, the first conductive pad 241 included in the second area "B" may be disposed to be adjacent to the first plating area 211 or the outer surface 204a. For example, the first conductive pad 241 included in the third area "C" may be disposed to be adjacent to the second plating area 212 or the inner surface 204b. Referring to the drawings, the second area "B" and the third area "C" may be disposed between two first areas "A". Referring to the drawings, the second area "B" and the third area "C" may be disposed alternately when viewed in the extension direction "E". That is, the first conductive pad 241 may be disposed in zigzags when viewed in the extension direction "E".

FIG. 8 is a cross-sectional view illustrating an interposer of an example electronic device according to an embodiment. For example, FIG. 8 is a cross-sectional view of the second area "B" of FIG. 7.

FIG. 9 is a cross-sectional view illustrating an interposer of an example electronic device according to an embodiment. For example, FIG. 9 is a cross-sectional view of the third area "C" of FIG. 7.

In an embodiment, the first conductive pad 241 and the second conductive pad 242 may be formed on a surface of the first insulation part 240. For example, each of the first conductive pad 241 and the second conductive pad 242 may be electrically connected to the first board 150. An insulation material may be disposed between the first conductive pad 241 and the second conductive pad 242. For example, the first conductive pad 241 and the second conductive pad 242 may be surrounded by a coating layer disposed on the surface of the first insulation part 240.

In various embodiments, the first insulation part 240 may be provided as a layer that is substantially parallel to the insulation layer 210. For example, a thickness of the first insulation part 240 may be approximately 100 micrometers. For example, a thickness of the coating layer disposed on the surface of the first insulation part 240 may be approximately 20 micrometers. In various embodiments, a thickness of the insulation layer 210 may be approximately 435 micrometers.

In various embodiments, the first conductive pad 241 and the second conductive pad 242 may have a size (e.g., a diameter) of approximately 300 micrometers. Furthermore, the conductive pads 241 and 242 may be disposed at an interval of approximately 300 micrometers from other adjacent conductive pads. However, the numbers mentioned in the disclosure are merely examples, and the disclosure is not limited to these numbers.

In an embodiment, the third conductive pad 251 and the fourth conductive pad 252 may be formed on a surface of the second insulation part 250. For example, each of the third conductive pad 251 and the fourth conductive pad 252 may be electrically connected to the second board 190. An insulation material may be disposed between the third conductive pad 251 and the fourth conductive pad 252. For example, the third conductive pad 251 and the fourth conductive pad 252 may be surrounded by a coating layer disposed on the surface of the second insulation part 250. In various embodiments, the second insulation part 250 may be provided as a layer that is substantially parallel to the insulation layer 210. For example, a thickness of the second insulation part 250 may be about 100 micrometers. For example, a thickness of the coating layer disposed on the surface of the second insulation part 250 may be about 20 micrometers. In various embodiments, a thickness of the insulation layer 210 may be about 435 micrometers.

In various embodiments, the third conductive pad 251 and the fourth conductive pad 252 may have a size (e.g., a diameter) of about 300 micrometers. Furthermore, the conductive pads 251 and 252 may be disposed at an interval of approximately 300 micrometers from other adjacent conductive pads. However, the numbers mentioned in the disclosure are merely examples, and the disclosure is not limited to these numbers.

In an embodiment, the first conductive layer 220 may include a first conductive area 221 and a second conductive area 222. The first conductive area 221 and the second conductive area 222 may be electrically insulated from each other. The first insulation part 240 may be disposed between the first conductive area 221 and the second conductive area 222. In an embodiment, the first conductive area 221 may be formed on a first surface of the insulation layer 210. The first conductive area 221 may extend to the first plating area 211 formed on the first side surface (e.g., the first side surface 210a of FIG. 6) of the insulation layer 210. In an embodiment, the second conductive area 222 may be formed on the first surface of the insulation layer 210. For example, the first conductive area 221 and the first conductive pad 241 may at least partially overlap each other when viewed in the first direction. Here, the first direction may be defined as the Z axis direction. Furthermore, the first direction may be defined as a direction that faces the second board (e.g., the second board 190 of FIG. 6) from the first board (e.g., the first board 150 of FIG. 6). The first direction may be a direction that is substantially perpendicular to the extension direction "E" of the interposer 200. For example, the second conductive area 222 and the second conductive pad 242 may at least partially overlap each other when viewed in the first direction.

In various embodiments, a thickness of the first conductive layer 220 may be approximately 35 micrometers. For example, thicknesses of the first conductive area 221 and the second conductive area 222 may be approximately 35 micrometers. In various embodiments, the first conductive area 221 and the second conductive area 222 may have a size (e.g., a diameter) of approximately 400 micrometers. The conductive areas 221 and 222 may be spaced apart from the adjacent conductive areas by approximately 250 micrometers or less. In various embodiments, the second conductive area 222 may be spaced apart from the first plating area 211 by approximately 700 micrometers. In various embodiments, the second plating area 212 may be spaced apart from the first plating area 211 by approximately 2 millimeters. In various embodiments, a thickness of the interposer 200 may be approximately 780 micrometers. Through the spacing distances, short-circuits between the pads and the conductive areas may be reduced and/or prevented. However, the numbers mentioned in the disclosure are merely examples, and the disclosure is not limited to these numbers.

In an embodiment, the second conductive layer 230 may include a third conductive area 231 and a fourth conductive area 232. The third conductive area 231 and the fourth conductive area 232 may be electrically insulated from each other. The second insulation part 250 may be disposed between the third conductive area 231 and the fourth conductive area 232. In an embodiment, the third conductive area 231 may be formed on the second surface of the insulation layer 210. The third conductive area 231 may extend to the first plating area 211 formed on the first side surface (e.g., the first side surface 210a of FIG. 6) of the insulation layer 210. In an embodiment, the fourth conductive area 232 may be formed on the second surface of the insulation layer 210. For example, the third conductive area 231 and the third conductive pad 251 may at least partially overlap each other when viewed in the first direction. For example, the fourth conductive area 232 and the fourth conductive pad 252 may at least partially overlap each other when viewed in the first direction.

In various embodiments, a thickness of the second conductive layer 230 may be approximately 35 micrometers. For example, thicknesses of the third conductive area 231 and the fourth conductive area 232 may be approximately 35 micrometers.

In various embodiments, the third conductive area 231 and the fourth conductive area 232 may have a size (e.g., a diameter) of approximately 400 micrometers. The conductive areas 231 and 232 may be spaced apart from the adjacent conductive areas by approximately 250 micrometers or less. In various embodiments, the fourth conductive area 232 may be spaced apart from the first plating area 211 by approximately 700 micrometers. In various embodiments, the second plating area 212 may be spaced apart from the first plating area 211 by approximately 2 millimeters. In various embodiments, a thickness of the interposer 200 may be approximately 780 micrometers. Through the spacing distances, short-circuits between the pads and the conductive areas may be reduced and/or prevented. However, the numbers mentioned in the disclosure are merely examples, and the disclosure is not limited to these numbers.

In an embodiment, the interposer 200 may include a plurality of conductive vias for providing an electrical connection of the first board 150 and the second board 190. The plurality of conductive vias may be defined according to applied signals. For example, the plurality of conductive vias may include the ground via Vg connected to the grounds of the first board 150 and the second board 190, and a signal via Vs connected to signal lines of the first board 150 and the second board 190.

In an embodiment, the ground via Vg may include a first part 281 that passes through the first insulation part 240, and a second part 282 that passes through the second insulation part 250. For example, the first part 281 may include a first via hole 281h that passes through the first insulation part 240, and a conductive material filled in the first via hole 281h. The first part 281 may electrically connect the first conductive pad 241 and the first conductive area 221. For example, the second part 282 may include a second via hole 282h that passes through the second insulation part 250, and a conductive material filled in the second via hole 282h. The second part 282 may electrically connect the third conductive pad 251 and the third conductive area 231.

In an embodiment, the first conductive area 221 and the third conductive area 231 may be electrically connected to each other by the first plating area 211. Accordingly, the interposer 200 may provide a ground path including the first part 281, the second part 282, the first conductive area 221, the third conductive area 231, and the first plating area 211 of the ground via Vg. The first conductive pad 241 may be coupled to the ground pad of the first board 150. For example, the first conductive pad 241 may be surface-mounted on the ground pad of the first board 150. The third conductive pad 251 may be coupled to the ground pad of the second board 190. For example, the third conductive pad 251 may be surface-mounted on the ground pad of the second board 190. When viewed in a cross-section, the ground path may have a "C" shape that at least partially surrounds the insulation layer 210.

In an embodiment, the first part 281 may be configured such that a cross-sectional area thereof decreases as it becomes closer to the insulation layer 210. The cross-sectional area may refer, for example, to an area when the first part 281 is viewed in a cross-section that is perpendicular to the first direction (e.g., the Z axis direction). For example, a cross-sectional area of a portion of the first part 281, which is adjacent to the first conductive area 221, may be smaller than a cross-sectional area of a portion of the first part 281, which is adjacent to the first conductive pad 241. In an embodiment, the first part 281 may have a cross-sectional area that is smaller than that of the first conductive pad 241. In an embodiment, the first part 281 may be formed by machining a laser hole in the first insulation part 240.

In an embodiment, the second part 282 may be configured such that a cross-sectional area thereof decreases as it becomes closer to the insulation layer 210. The cross-sectional area may refer, for example, to an area of the second part 282 when viewed in a cross-section that is perpendicular to the first direction. For example, a cross-sectional area of a portion of the second part 282, which is adjacent to the third conductive area 231, may be smaller than a cross-sectional area of a portion of the second part 282, which is adjacent to the third conductive pad 251. In an embodiment, the second part 282 may have a cross-sectional area that is smaller than that of the third conductive pad 251. In an embodiment, the second part 282 may be formed by machining a laser hole in the second insulation part 250.

In an embodiment, the signal via Vs may include the third part 291 that passes through the first insulation part 240, the fourth part 292 that passes through the second insulation part 250, and the fifth part 293 that passes through the insulation layer 210.

In an embodiment, the third part 291 may include a third via hole 291h that passes through the first insulation part 240, and a conductive material filled in the third via hole 291h. The third part 291 may electrically connect the second conductive pad 242 and the second conductive area 222.

In an embodiment, the fourth part 292 may include a fourth via hole 292h that passes through the second insulation part 250, and a conductive material filled in the fourth via hole 292h. The fourth part 292 may electrically connect the fourth conductive pad 252 and the fourth conductive area 232.

In an embodiment, the fifth part 293 may electrically connect the third part 291 and the fourth part 292. The fifth part 293 may include a fifth via hole 293h that passes through the insulation layer 210, and a conductive material 2931 that is plated on an inner wall of the fifth via hole 293h and a peripheral area of the fifth via hole 293h. For example, the conductive material 2931 plated on the peripheral area of the fifth via hole 293h may form the second conductive area 222 and the fourth conductive area 232. In an embodiment, the fifth part 293 may further include an insulation material 2932 located in an interior of the fifth via hole 293h. The insulation material 2932 may be filled in the fifth via hole 293h to firmly maintain the conductive material 2931 plated on an inner wall of the fifth via hole 293h. In an embodiment, the conductive material 2931 may include at least one of copper, silver paste, aluminum, silver-aluminum, carbon paste, or carbon nanotube paste, but the disclosure is not limited thereto.

In an embodiment, the interposer 200 may provide a signal transmission path including the second conductive pad 242, the third part 291, the second conductive area 222, the fifth part 293, the fourth conductive area 232, the fourth part 292, and the fourth conductive pad 252. For example, the signal transmission path may transmit signals between the first board 150 and the second board 190. For example, the second conductive pad 242 may at least partially contact a signal pad of the first board 150. The second conductive pad 242 may be surface-mounted on the first board 150. For example, the fourth conductive pad 252 may at least partially contact a signal pad of the second board 190. The fourth conductive pad 252 may be surface-mounted on the second board 190.

In an embodiment, the third part 291 may be configured such that a cross-sectional area thereof decreases as it becomes closer to the insulation layer 210. The cross-sectional area may refer, for example, to an area of the second part 282 when viewed in a cross-section that is perpendicular to the first direction. For example, a cross-sectional area of a portion of the third part 291, which is adjacent to the second conductive area 222, may be smaller than a cross-sectional area of a portion of the third part 291, which is adjacent to the second conductive pad 242. In an embodiment, the third part 291 may have a cross-sectional area that is smaller than that of the second conductive pad 242. In an embodiment, the third part 291 may be formed by machining a laser hole in the first insulation part 240.

In an embodiment, the fourth part 292 may be configured such that a cross-sectional area thereof decreases as it becomes closer to the insulation layer 210. The cross-sectional area may refer, for example, to an area of the second part 282 when viewed in a cross-section that is perpendicular to the first direction. For example, a cross-sectional area of a portion of the fourth part 292, which is adjacent to the fourth conductive area 232, may be smaller than a cross-sectional area of a portion of the fourth part 292, which is adjacent to the fourth conductive pad 252. In an embodiment, the fourth part 292 may have a cross-sectional area that is smaller than that of the fourth conductive pad 252. In an embodiment, the fourth part 292 may be formed by machining a laser hole in the second insulation part 250.

In an embodiment, the fifth part 293 may have a cross-sectional area that is relatively uniform as compared with that of the third part 291 or the fourth part 292. The cross-sectional area may refer, for example, to an area when viewed in a cross-section that is perpendicular to the first direction.

In an embodiment, a cross-sectional area of the fifth part 293 may be larger than a cross-sectional area of the third part 291 or the fourth part 292. For example, the fifth part 293 may be formed through machining (e.g., drilling or sawing) of the insulation layer 210, and the third part 291 or the fourth part 292 may be formed through laser hole forming of the insulation parts 240 and 250.

In an embodiment, a center axis of the fifth part 293 may be biased (offset) from a center axis of the third part 291 or the fourth part 292 by a specific distance. This may be understood that at least two different processes are performed to form the signal via. For example, portions of the signal via may have center axes that are parallel to each other but do not coincide with each other.

According to an embodiment, machining methods for the first to fifth parts 281 to 293 may be variously used. For example, the ground via Vg and the signal via Vs may be implemented by a plated through hole, a laser via hole, a buried via hole, or a stacked via.

In an embodiment, the conductive pads (e.g., the first conductive pad 241, the second conductive pad 242, the third conductive pad 251, or the fourth conductive pad 252) may be electrically connected to the boards (e.g., the first board 150 or the second board 190) through a joining member such as pre-solder. For example, the pre-solder may fasten the conductive pads and the pads (e.g., the ground pad or the signal pad) of the board, through a reflow process, when the first board 150 and the second board 190 are coupled to the interposer 200. According to an embodiment, a reflow process is a process of supplying solder to a land (e.g., the pad) of the board in advance and fusing the solder with an external heat source for connection, and may include a soldering process for soldering the land to the board. In some embodiments, the soldering process is not limited to the reflow soldering, but various methods such as flow soldering in addition to the reflow soldering may be used.

Figure 10:
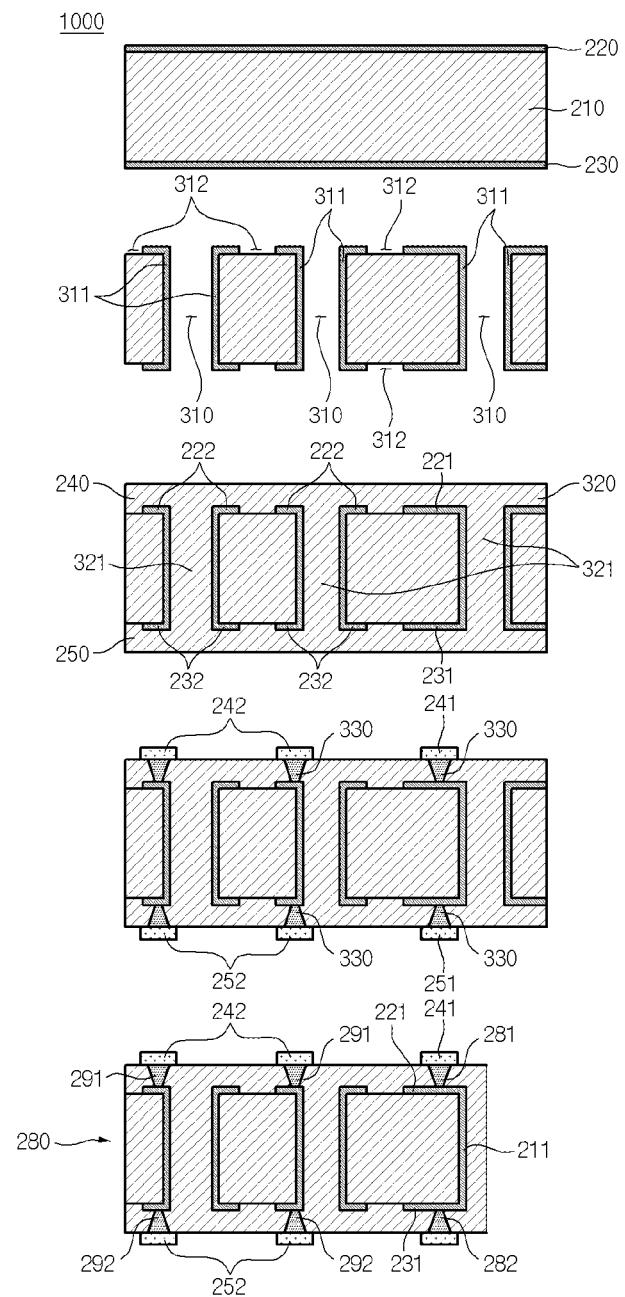
FIG. 10 is a view illustrating an example of a method for manufacturing an interposer of an example electronic device according to an embodiment.

FIG. 10 is a view illustrating an example of a method for manufacturing an interposer of an electronic device according to an embodiment.

Referring to FIG. 10, a method 1000 for manufacturing the interposer 200 may include forming first via holes 310 in the layer structure including the insulation layer 210, the first conductive layer 220, and the second conductive layer 230, plating the inner walls of the first via holes 310, forming the conductive areas 221, 222, 231, and 232 in the first conductive layer 220 and the second conductive layer 230, filling an insulation material 320, and forming the vias 330 (e.g., the first part 281, the second part 282, the third part 291, the fourth part 292), and the conductive pads 241, 242, 251, and 252.

For example, the layer structure may include the first conductive layer 220, the second conductive layer 230, and the insulation layer 210 formed between the first conductive layer 220 and the second conductive layer 230. For example, the first via hole 310 may be formed through a mechanical process such as a drilling process. The first via holes 310 may pass through the first conductive layer 220, the second conductive layer 230, and the insulation layer 210. The first via holes 310 may pass in a direction (e.g., the Z axis direction) that is perpendicular to the first conductive layer 220, the second conductive layer 230, and the insulation layer 210.

In an embodiment, a conductive material 311 (e.g., the conductive material 2931 of FIG. 8 or FIG. 9) may be located on the inner wall of the first via hole 310 through a plating process. The conductive material 311 may include copper. The conductive material 311 may not include gold. In various embodiments, the conductive material 311 may form the conductive material 2931 located in the side plating areas 211 and 212 illustrated in FIG. 8 or FIG. 9 or an the inner wall of the fifth via hole 293h of the signal via. In an embodiment, the first conductive area 221 and the second conductive area 222 may be formed in the first conductive layer 220. The first conductive area 221 and the second conductive area 222 may be formed by removing a partial area 312 of the first conductive layer 220. In an embodiment, the third conductive area 231 and the fourth conductive area 232 may be formed in the second conductive layer 230. The third conductive area 231 and the fourth conductive area 232 may be formed by removing a partial area 312 of the second conductive layer 230. In an embodiment, the conductive areas 221, 222, 231, and 232 are areas that surround the first via hole 310, and may be connected to the conductive material 311 of the inner wall of the first via hole 310. For example, the conductive areas may be electrically insulated from the other areas due to the removed areas 312. In various embodiments, the conductive areas 221, 222, 231, and 232 may be provided through an etching process of etching partial areas (e.g., the removed areas 312) of the conductive layers 220 and 230.

In an embodiment, the filling of the insulation material 320 may include filling the interior of the first via holes 310, and laminating the insulation material 320 on a surface of the first conductive layer 220 and a surface of the second conductive layer 230. For example, an insulation material 321 filled in the interior of the first via hole 310 may firmly attach the conductive material 311 to an inner wall.

In various embodiments, a portion of the insulation material 321 filled in the first via hole 310 may form the first side insulation part (e.g., the first side insulation part 260 of FIG. 8 or FIG. 9) or the second side insulation part (e.g., the second side insulation part 270 of FIG. 8 or FIG. 9). In various embodiments, a portion of the insulation material 320 may be laminated on a surface of the first conductive layer 220 to form the first insulation part 240. A portion of the insulation material 320 may be laminated on a surface of the second conductive layer 230 to form the second insulation part 250.

In an embodiment, the first conductive pad 241 and the second conductive pad 242 may be disposed on the surface of the first insulation part 240. The first conductive pad 241 and the second conductive pad 242 may be provided by etching a portion of the conductive layer additionally laminated on the first insulation part 240.

In an embodiment, the third conductive pad 251 and the fourth conductive pad 252 may be disposed on the surface of the second insulation part 250. The third conductive pad 251 and the fourth conductive pad 252 may be provided by etching a portion of the conductive layer additionally laminated on the second insulation part 250.

In an embodiment, vias 330 (e.g., the first part 281 and the third part 291) that pass through the first insulation part 240 may be formed. The vias 330 may connect the first conductive pad 241 and the first conductive area 221, or connect the second conductive pad 242 and the second conductive area 222. The vias 330 may include the first via hole 281h and the third via hole 291h illustrated in FIGS. 8 and 9.

In an embodiment, vias 330 (e.g., the second part 282 and the fourth part 292) that pass through the second insulation part 250 may be formed. The second vias 330 may connect the third conductive pad 251 and the third conductive area 231, or connect the fourth conductive pad 252 and the fourth conductive area 232. The second vias may include the second via hole 282h and the fourth via hole 292h illustrated in FIGS. 8 and 9.

In an embodiment, as the structure, in which the second vias 330 are finished, is cut, a portion of the filled insulation material 321 may be exposed to a side surface of the interposer 200. The portion exposed to the side surface may define the first side insulation part 260 and the second side insulation part 270.

The interposer 200 according to embodiments disclosed in the disclosure may enhance a shielding performance because the ground via Vg is disposed in an area, in which the side plating area included in a conventional interposer is opened. Furthermore, because the side plating area is covered by the first side insulation part 260 and the second side insulation part 270, a gold plating process of covering a side plating area may be omitted, and production costs of the interposer 200 may be decreased.

Furthermore, the interposer 200 according to embodiments of the disclosure includes laser machined vias (e.g., the first via hole 281h, the second via hole 282h, the third via hole 291h, and the fourth via hole 292h) as compared with the conventional interposer, and thus sizes of the vias may be decreased. The conductive pads are spaced apart from each other at a sufficient interval due to the vias having the reduced sizes, and concerns about short-circuits may be decreased. Furthermore, while the number signal vias is insufficient in a conventional interposer, the interposer 200 includes a larger number of vias and a sufficient number of signal vias may be provided.

An electronic device 100 according to an embodiment disclosed in the disclosure may include the housing 110, the first board 150 and the second board 190 disposed in an interior of the housing 110 and disposed to face each other in a first direction, the interposer 200 extending to surround an interior space between the first board 150 and the second board 190, the first conductive layer 220 disposed to face the first board and including the first conductive area 221, the second conductive layer 230 disposed to face the second board 190 and including the second conductive area 231, the insulation layer 210 disposed between the first conductive layer 220 and the second conductive layer 230, the first insulation part 240 disposed between the first conductive layer 220 and the first board 150 and covering the first conductive area 221, the second insulation part 250 disposed between the second conductive layer 230 and the second board 190 and covering the second conductive area 231, the first plating area 211 extending from the first conductive layer 220 to the second conductive layer 230, on a first side surface of the insulation layer 210, the second plating area 212 extending from the first conductive layer 220 to the second conductive layer 230, on a second side surface of the insulation layer 210, the ground via Vg including the first part 281 passing through the first insulation part 240 and connected to the first conductive area 221, and the second part 282 passing through the second insulation part 250 and connected to the second conductive area 231, wherein the first conductive area 221 and the second conductive area 231 are electrically connected to each other through the first plating area 211, and the signal via Vs passing from the first insulation part 240 to the second insulation part 250.

In various embodiments, the interposer may include the first side insulation part 260 extending from the first insulation part 240 to the second insulation part 250 and covering the first plating area 211, and the second side insulation part 270 extending from the first insulation part 240 to the second insulation part 250 and covering the second plating area 212.

In various embodiments, the first side insulation part 260 and the second side insulation part 270 may be integrally formed with the first insulation part 240 and the second insulation part 250.

In various embodiments, the first side insulation part 260 may define an outer surface of the interposer, and the second side insulation part 270 may define an inner surface of the interposer.

In various embodiments, the first conductive pad 241 electrically connected to the first board 150 may be formed in the first insulation part 240, the first conductive pad 241 may be connected to the first conductive area 221 through the first part 281 of the ground via Vg, a second conductive pad 251 electrically connected to the second board 190 may be formed in the second insulation part 250, and the second conductive pad 251 may be connected to the second conductive area 231 through the second part 282 of the ground via Vg.

In various embodiments, the ground via Vg may electrically connect a ground of the first board 150 and a ground of the second board 190, the first conductive pad 241 may at least partially contact a ground pad of the first board 150, and the second conductive pad 251 may at least partially contact a ground pad of the second board 190.

In various embodiments, the first plating area 211 and the second plating area 212 may extend long along the extension direction "E" of the interposer 200 to surround the interior space.

In various embodiments, the first part 281 of the ground via Vg may be provided in a form, in which a cross-sectional area thereof becomes smaller as it becomes closer to the first conductive area 221, and the second part 282 of the ground via Vg may be provided in a form, in which a cross-sectional area thereof becomes smaller as it becomes closer to the second conductive area.

In various embodiments, the interposer 200 may include a first surface at least partially contacting the first board, a second surface at least partially contacting the second board, the inner surface 204a facing the interior space, and the outer surface 204b being opposite to the inner surface and facing an outside of the interior space, the ground via Vg may be located adjacent to any one of the inner surface 204a or the outer surface 204b, when the first surface is viewed from a top, and the signal via Vs may be located between the other one of the inner surface 204a or the outer surface 204b and the ground via Vg, when the first surface is viewed from the top.

In various embodiments, the interposer 200 may further include a second ground via Vg, the second ground via Vg may include the third part 281 passing through the first insulation part 240 and connected to the third conductive area 221 included in the first conductive layer 220, and the fourth part 282 passing through the second insulation part 250 and connected to the fourth conductive area 231 included in the second conductive layer 230, and the third conductive area 221 and the fourth conductive area 231 may be electrically connected to each other through the second plating area 212.

In various embodiments, the second ground via Vg may be located adjacent to any one of the inner surface 204a or the outer surface 204b, when the first surface is viewed from the top.

In various embodiments, a plurality of ground vias Vg may be provided, and the signal via Vs may be disposed between any one of the plurality of ground vias Vg and another adjacent one of the plurality of ground vias Vg, when viewed in an extension direction "E" of the interposer 200.

In various embodiments, the signal via Vs may include a fifth part 293 passing through the insulation layer 210, a sixth part 291 passing through the first insulation part 240, and a seventh part 292 passing through the second insulation part 250.

In various embodiments, the fifth part 293 and the sixth part 291 may be electrically connected to the fifth conductive area 222 included in the first conductive layer 220, and the fifth part 293 and the seventh part 292 may be electrically connected to the sixth conductive area 232 included in the second conductive layer 230.

In various embodiments, a cross-sectional area of the fifth part 293 may be larger than a cross-sectional area of the sixth part 291 or the seventh part 292.

In various embodiments, the fifth part 293 may have a uniform cross-sectional area.

In various embodiments, the sixth part 291 and the seventh part 292 may be provided in a form, in which a cross-sectional area thereof becomes smaller as it becomes closer to the insulation layer 210.

In various embodiments, a center axis of the fifth part 293 may be biased (offset) from a center axis of the sixth part 291 or the seventh part 292 at a specific interval.

In various embodiments, the interposer may include a first area "A", in which the ground via is disposed between the first plating area 211 and the second plating area 212, a second area "B" that is an area, in which the ground via Vg and the signal via Vs are disposed between the first plating area 211 and the second plating area 212, and in which the ground via Vg is adjacent to the first plating area 211, and a third area "C" that is an area, in which the ground via Vg and the signal via Vs are disposed between the first plating area 211 and the second plating area 212, and in which the ground via Vg is adjacent to the second plating area 212.

In various embodiments, the second area "B" and the third area "C" may be disposed be disposed between two first areas "A", when viewed in the extension direction "E".

In various embodiments, the second area "B" and the third area "C" may be disposed between two first areas, when viewed in the extension direction "E".

The various embodiments of the disclosure and the terms used herein do not limit the technology described in the disclosure to specific forms, and should be construed to include various modifications, equivalents, and/or replacements of the embodiments. With regard to description of drawings, similar components may be marked by similar reference numerals. The terms of a singular form may include plural forms unless otherwise specified. In the disclosure disclosed herein, the expressions "A or B", or "at least one of A or/and B", "A, B, or C", or "at least one of A, B, or/and C", and the like used herein may include any and all combinations of one or more of the associated listed items. The terms, such as "first", "second", and the like used herein may refer to various elements of various embodiments of the disclosure, but do not limit the elements. For example, such terms are used only to distinguish an element from another element and do not limit the order and/or priority of the elements. If it is mentioned that an element (e.g., a first element) is (functionally or communicatively) "connected" to another element (e.g., a second element), the first element may be directly connected to the second element or may be connected to the second element through another element (e.g., a third element).

In the disclosure, the expression "configured to" may be interchangeably used with, for example, "suitable for", "capable of", "modified to", "made to", "able to", or "designed to" according to a situation in a hardware or software way. In some situations, the expression "a device configured to" may refer, for example, to the device being "capable of" operating together with another device or other components. CPU, for example, a "processor configured to (or set to) perform A, B, and C" may mean a dedicated processor (e.g., an embedded processor) for performing a corresponding operation or a generic-purpose processor (e.g., a central processing unit (CPU) or an application processor) which may perform corresponding operations by executing one or more programs which are stored in a memory device<0}

The term "module" used in the disclosure may include a unit configured in a hardware, software, or firmware or any combination thereof, and for example, may be used interchangeably with the terms such as logic, a logic block, a component, or a circuit. The "module" may be an integral component, or a minimum unit or a part which performs one or more functions. The "module" may be implemented mechanically or electronically, and for example, may include an application-specific integrated circuit (ASIC) chip, field-programmable gate arrays (FPGSs), or a programmable logic device that is known or to be developed in the future, which performs some operations.

At least some of the devices (e.g., modules or functions) or methods (e.g., operations) according to various embodiments of the disclosure may be implemented by an instruction stored in a computer-readable storage medium (e.g., the memory), for example, in the form of a program module. When the instruction is executed by the processor (for example, the processor), the at least one processor may perform a function corresponding to the instruction. The computer-readable recording medium may include a hard disk, a floppy disk, a magnetic medium (e.g., a magnetic tape), an optical recording medium (e.g., a CD-ROM or a DVD), an magneto-optical medium (e.g., a floptical disk), and an embedded memory. The instruction may include a code made by a compiler or a code that may be executed by an interpreter.

Each of the elements (e.g., a module or a program) according to various embodiments may include a single or a plurality of entities, and some of the corresponding sub-elements may be omitted or another sub-element may be further included in various embodiments. Alternatively or additionally, some elements (e.g., a module or a program module) may be integrated into one entity to perform functions performed by the corresponding elements before the integration in the same way or similarly. The operations performed by a module, a program module, or another element according to various embodiments may be executed sequentially, in parallel, repeatedly, or heuristically, or at least some operations may be executed in another sequence or may be omitted, or another operation may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:
    a housing;
    a first board and a second board disposed in an interior of the housing and disposed to face each other in a first direction; and
    an interposer extending to surround an interior space between the first board and the second board, the interposer including:
        a first conductive layer disposed to face the first board and including a first conductive area;
        a second conductive layer disposed to face the second board and including a second conductive area;
        an insulation layer disposed between the first conductive layer and the second conductive layer;
        a first insulation part disposed between the first conductive layer and the first board and covering the first conductive area;
        a second insulation part disposed between the second conductive layer and the second board and covering the second conductive area;
        a first plating area extending from the first conductive layer to the second conductive layer, on a first side surface of the insulation layer;
        a second plating area extending from the first conductive layer to the second conductive layer, on a second side surface of the insulation layer;
        a ground via including a first part passing through the first insulation part and connected to the first conductive area, and a second part passing through the second insulation part and connected to the second conductive area, wherein the first conductive area and the second conductive area are electrically connected to each other through the first plating area; and
        a signal via passing from the first insulation part to the second insulation part.

2. The electronic device of claim 1, wherein the interposer further includes:
    a first side insulation part extending from the first insulation part to the second insulation part and covering the first plating area; and
    a second side insulation part extending from the first insulation part to the second insulation part and covering the second plating area.

3. The electronic device of claim 2, wherein the first side insulation part and the second side insulation part are integrally formed with the first insulation part and the second insulation part.

4. The electronic device of claim 2, wherein the first side insulation part defines an outer surface of the interposer, and
    wherein the second side insulation part defines an inner surface of the interposer.

5. The electronic device of claim 1, wherein a first conductive pad electrically connected to the first board is formed on the first insulation part,
    wherein the first conductive pad is connected to the first conductive area through the first part of the ground via,
    wherein a second conductive pad electrically connected to the second board is formed on the second insulation part, and
    wherein the second conductive pad is connected to the second conductive area through the second part of the ground via.

6. The electronic device of claim 5, wherein the ground via electrically connects a ground of the first board and a ground of the second board,
    wherein the first conductive pad at least partially contacts a ground pad of the first board, and
    wherein the second conductive pad at least partially contacts a ground pad of the second board.

7. The electronic device of claim 5, wherein a cross-sectional area of the first part of the ground via decreases in a direction toward the first conductive area, and
    wherein a cross-sectional area of the second part of the ground via decreases in a direction toward the second conductive area.

8. The electronic device of claim 1, wherein the interposer includes a first surface at least partially contacting the first board, a second surface at least partially contacting the second board, an inner surface facing the interior space, and an outer surface being opposite to the inner surface and facing an outside of the interior space,
- wherein the ground via is located adjacent to any one of the inner surface or the outer surface, when the first surface is viewed from a top, and
- wherein the signal via is located between the other one of the inner surface or the outer surface and the ground via, when the first surface is viewed from the top.

9. The electronic device of claim 8, wherein the interposer further includes a second ground via,
- wherein the second ground via includes a third part passing through the first insulation part and connected to a third conductive area included in the first conductive layer, and a fourth part passing through the second insulation part and connected to a fourth conductive area included in the second conductive layer, and
- wherein the third conductive area and the fourth conductive area are electrically connected to each other through the second plating area.

10. The electronic device of claim 9, wherein the second ground via is located adjacent to any one of the inner surface or the outer surface, when the first surface is viewed from the top.

11. The electronic device of claim 1, wherein a plurality of ground vias are provided, and
- wherein the signal via is disposed between any one of the plurality of ground vias and another adjacent one of the plurality of ground vias, when viewed in an extension direction of the interposer.

12. The electronic device of claim 1, wherein the signal via includes a fifth part passing through the insulation layer, a sixth part passing through the first insulation part, and a seventh part passing through the second insulation part.

13. The electronic device of claim 12, wherein the fifth part and the sixth part are electrically connected to a fifth conductive area included in the first conductive layer, and wherein the fifth part and the seventh part are electrically connected to a sixth conductive area included in the second conductive layer.

14. The electronic device of claim 12, wherein a cross-sectional area of the fifth part is larger than a cross-sectional area of the sixth part or the seventh part.

15. The electronic device of claim 12, wherein the fifth part has a uniform cross-sectional area.

16. The electronic device of claim 12, wherein cross-sectional areas of the sixth part and the seventh part decrease in a direction toward the insulation layer.

17. The electronic device of claim 12, wherein a center axis of the fifth part is biased from a center axis of the sixth part or the seventh part at a specific interval.

18. The electronic device of claim 1, wherein the interposer further includes:
- a first area, in which the ground via is disposed between the first plating area and the second plating area;
- a second area, in which the ground via and the signal via are disposed between the first plating area and the second plating area, and in which the ground via is adjacent to the first plating area; and
- a third area, in which the ground via and the signal via are disposed between the first plating area and the second plating area, and in which the ground via is adjacent to the second plating area.

19. The electronic device of claim 18, wherein the second area and the third area are disposed between two first areas, when viewed in an extension direction of the interposer.

20. The electronic device of claim 18, wherein the second area and the third area are disposed alternately, when viewed in an extension direction of the interposer.

* * * * *